United States Patent
Madocks

(10) Patent No.: US 7,038,389 B2
(45) Date of Patent: May 2, 2006

(54) MAGNETRON PLASMA SOURCE

(75) Inventor: John Madocks, Tuscon, AZ (US)

(73) Assignee: Applied Process Technologies, Inc., Tucson, AZ (US)

( * ) Notice: Subject to any disclaimer, the term of this patent is extended or adjusted under 35 U.S.C. 154(b) by 0 days.

(21) Appl. No.: 10/835,748

(22) Filed: Apr. 30, 2004

(65) Prior Publication Data

US 2004/0217713 A1 Nov. 4, 2004

Related U.S. Application Data

(60) Provisional application No. 60/467,696, filed on May 2, 2003.

(51) Int. Cl.
*H01J 7/24* (2006.01)

(52) U.S. Cl. ........................ 315/111.21; 118/723 MW; 204/298

(58) Field of Classification Search ........................ 315/111.21–111.81; 118/723 HC, 723 I, 723 ME, 118/723 MW; 204/192.11, 192.12, 298
See application file for complete search history.

(56) References Cited

U.S. PATENT DOCUMENTS

| | | | |
|---|---|---|---|
| 3,309,873 A | 3/1967 | Cann ........................ 60/203.1 |
| 3,913,320 A | 10/1975 | Reader, et al. ................. 60/202 |
| 4,868,003 A | 9/1989 | Temple et al. .......... 204/298.06 |
| 4,871,918 A | 10/1989 | Miljevic ...................... 118/719 |
| 4,885,070 A * | 12/1989 | Campbell et al. ....... 204/298.06 |
| 4,915,805 A | 4/1990 | Rust ........................ 204/192.12 |
| 4,933,057 A | 6/1990 | Sebastiano et al. .... 204/192.12 |
| 4,941,430 A | 7/1990 | Watanabe et al. ...... 118/723 FE |
| 5,073,245 A | 12/1991 | Hedgcoth ............... 204/298.21 |
| 5,126,030 A | 6/1992 | Tamagaki et al. ....... 204/192.38 |
| 5,132,597 A | 7/1992 | Goebel et al. .............. 315/344 |
| 5,334,302 A | 8/1994 | Kubo et al. ............. 204/298.18 |
| 5,482,611 A | 1/1996 | Helmer et al. .......... 204/298.17 |
| 5,614,248 A | 3/1997 | Schiller et al. ................. 427/8 |
| 5,656,141 A | 8/1997 | Betz et al. ............. 204/298.05 |
| 5,855,745 A | 1/1999 | Manley .................. 204/192.12 |
| 5,908,602 A | 6/1999 | Bardos et al. .......... 422/186.03 |
| 5,914,051 A * | 6/1999 | Kanai et al. ........ 118/723 MW |
| 6,103,074 A | 8/2000 | Khominich ............ 204/192.38 |
| 6,211,622 B1 * | 4/2001 | Ryoji et al. .............. 315/111.21 |
| 6,323,586 B1 | 11/2001 | Zhurin et al. ................ 313/156 |
| 6,444,100 B1 | 9/2002 | McLeod ................. 204/192.16 |
| 6,444,945 B1 | 9/2002 | Maschwitz et al. ..... 219/121.54 |

OTHER PUBLICATIONS

Window, et al., "Charged particle fluxes from planar magnetron sputtering source", Journal of Vacuum Science and Technology A, vol. 4, Mar./Apr. 1986, pp. 196-202.

(Continued)

*Primary Examiner*—Wilson Lee
(74) *Attorney, Agent, or Firm*—Cahill, von Hellens & Glazer, P.L.C.

(57) ABSTRACT

A point projection type flood plasma source implements a magnetron sputter cold cathode electron source in a discharge cavity separated from a process chamber by a narrow conduit and a solenoid magnetic field. The solenoid magnetic field impedes radial electron flow in the nozzle and the process chamber. Process gas flows into the discharge cavity and through the nozzle to the process chamber. This gas is ionized in the nozzle and the process chamber by electrons trapped in the solenoid magnetic field. The result is a dense plasma plume in the process chamber useful for a number of applications. The source has particular advantages for reactive gas processes such as those requiring oxygen.

5 Claims, 2 Drawing Sheets

OTHER PUBLICATIONS

Window, et al., "Unbalanced dc magnetrons as sources of high ion fluxes", Journal of Vacuum Science and Technology A, vol. 4, May/Jun. 1986, pp. 453-456.

Window, et al., "Ion-assisting magnetron sources: Principles and uses", Journal of Vacuum Science and Technology A, vol. 8, May/Jun. 1996, pp. 1277-1282.

* cited by examiner

MAGNETRON PLASMA SOURCE

This application claims benefit of Ser. No. 60/467,696, filed on May 2, 2003.

The invention relates to a magnetron plasma source.

FIELD OF THE INVENTION

The invention relates to a magnetron plasma source.

BACKGROUND OF THE INVENTION

The present invention relates to electron, plasma and ion sources for industrial and space propulsion applications. Plasma and ion sources have found important industrial uses particularly in the semiconductor, telecom and optics fields. Another application for plasma and ion sources is as electric engines for space vehicle propulsion. To address these applications a wide variety of sources have been developed. One group of sources can be described as point projection sources. These plasma or ion sources typically include a discharge cavity where plasma is generated and a means to expel or accelerate the plasma or ions from this cavity into a process chamber. Several of these sources implement magnetic fields to control electron motion for improved source performance. Generally, these plasma and ion sources also have at least one electron source to create the plasma in the discharge cavity. Electrons are used to create the plasma because they can readily absorb energy from an electric field and the energetic electrons are used ionize and heat the process gas or propellant.

The present invention relates to an improved point projection plasma or ion source. Prior art point projection type sources pertaining to the present invention include:

U.S. Pat. No. 3,309,873 discloses a plasma accelerator using Hall currents that implemented a solenoid axial magnetic field between a discharge cavity and the process chamber—in this case space. An arc from a tungsten pin to the anode generated electrons to fuel the plasma discharge. No magnetron sputter electron confinement exists inside the discharge chamber.

U.S. Pat. No. 3,913,320 describes an electron-bombardment ion source implementing a hot filament electron cathode centered inside an ion source discharge cavity. An axial magnetic field impedes electron flow to an annular anode. An aligned screen and grid structure separates the discharge cavity from the process chamber and serves to accelerate ions from the discharge cavity plasma into the process chamber.

U.S. Pat. No. 4,871,918 discloses a hollow anode ion-electron source with a plasma beam emanating from a small hole or slit in an anode plate. There is no magnetron confinement in the discharge chamber. Additionally, the hole or slit in the anode is small relative to the electron gyro radius so electrons are not magnetically impeded from the anode hole walls.

U.S. Pat. No. 4,885,070 discloses a method and apparatus for the application of materials using a hot filament type cathode to generate electrons in a discharge chamber connected to a process chamber by a solenoid electromagnet tube conduit. The inner walls of the conduit tube are connected as the anode. Argon gas flows into the tube near the electron emitter and is ionized by the magnetized electrons.

U.S. Pat. No. 5,126,030 discloses a solenoid magnetic field used to conduct the ion flow from a cathode arc discharge from a cathode target in a discharge chamber to the substrates in a process chamber. No magnetron sputter discharge exists in the discharge chamber.

U.S. Pat. No. 5,656,141 describes an apparatus for coating substrates using a heated electron source in a discharge cavity separated from the process chamber by a solenoid electromagnet conduit. Argon is delivered into the conduit near the cathode emitter. The electrons ionize the argon gas and a plasma cloud in the process chamber is created. The heated cathode is lanthanum hexaboride $LaB_6$. The difficulty with this source, as with all sources implementing thermionic emitting cathodes, is the cathode life is shortened by contact with oxygen gas. Because of this, oxygen is not delivered directly into the source but is fed downstream outside the solenoid magnetic field. In addition to downstream oxygen flow, high argon flows through the source are used to keep oxygen from flowing into the source and contaminating the cathode.

The inability to directly 'burn' oxygen creates several limitations and challenges: 1) The argon purge gas adds to the overall pumping load mandating larger and more expensive vacuum pumps. 2) The downstream activation/ionization of the oxygen gas is less efficient than ionizing the process gas inside the plasma source. 3) Uniformity of oxygen plasma density at the substrates is reduced when oxygen is introduced outside the discharge chamber. And 4) Even with the argon purge gas, the expensive cathode requires replacement at accelerated intervals when oxygen is used in the process.

U.S. Pat. No. 5,855,745 describes an end hall type ion source centered in a planar magnetron cathode. The planar magnetron is used as the electron source for the ion source and to neutralize the ion beam. In this configuration independent magnetic circuits are used—a racetrack magnetron circuit for the planar magnetron and an axial field for the end hall ion source. The planar magnetron is directly facing the substrates and is not enclosed in a separate discharge chamber.

U.S. Pat. No. 6,323,586 describes a closed drift hollow cathode as an improved electron source. There is no magnetron confinement inside the discharge chamber and electrons are not magnetically impeded from reaching the chamber side walls nor are they magnetically conducted out of the discharge chamber to the process chamber.

An improved plasma source would be able to directly 'burn' oxygen gas in the plasma source without requiring an inert purge gas. It would also not require expensive filaments or thermionic cathode materials that are fragile and require frequent replacement. The improved plasma source would also not have hot cathodes that introduce a thermal load on the substrates.

SUMMARY OF THE INVENTION

Applicant's invention includes a plasma source, comprising a process chamber, a cylindrical discharge cavity, and a magnetron sputter cold cathode electron source disposed within that discharge cavity.

A spool anode, axis symmetric with the discharge cavity comprises a first end formed to include a first aperture, a second end formed to include a second aperture, and a conduit nozzle extending through the spool interconnecting the first aperture and the second aperture. The first end of the spool anode is disposed adjacent to the top portion of the discharge cavity; and the nozzle interconnects the discharge cavity and the process chamber.

An electromagnet is wound around the spool, where that electromagnet generates a magnetic field disposed within the process chamber, the discharge cavity, and the nozzle. A power supply is interconnected between the cathode and the spool anode such that electrons emanating from the magnetron sputter cathode electron source are impeded from reaching the anode by the magnetic field.

BRIEF DESCRIPTION OF THE DRAWINGS

The invention will be better understood from a reading of the following detailed description taken in conjunction with the drawings in which like reference designators are used to designate like elements, and in which.

DETAILED DESCRIPTION OF THE PRESENTLY PREFERRED EMBODIMENTS

Figure 1:
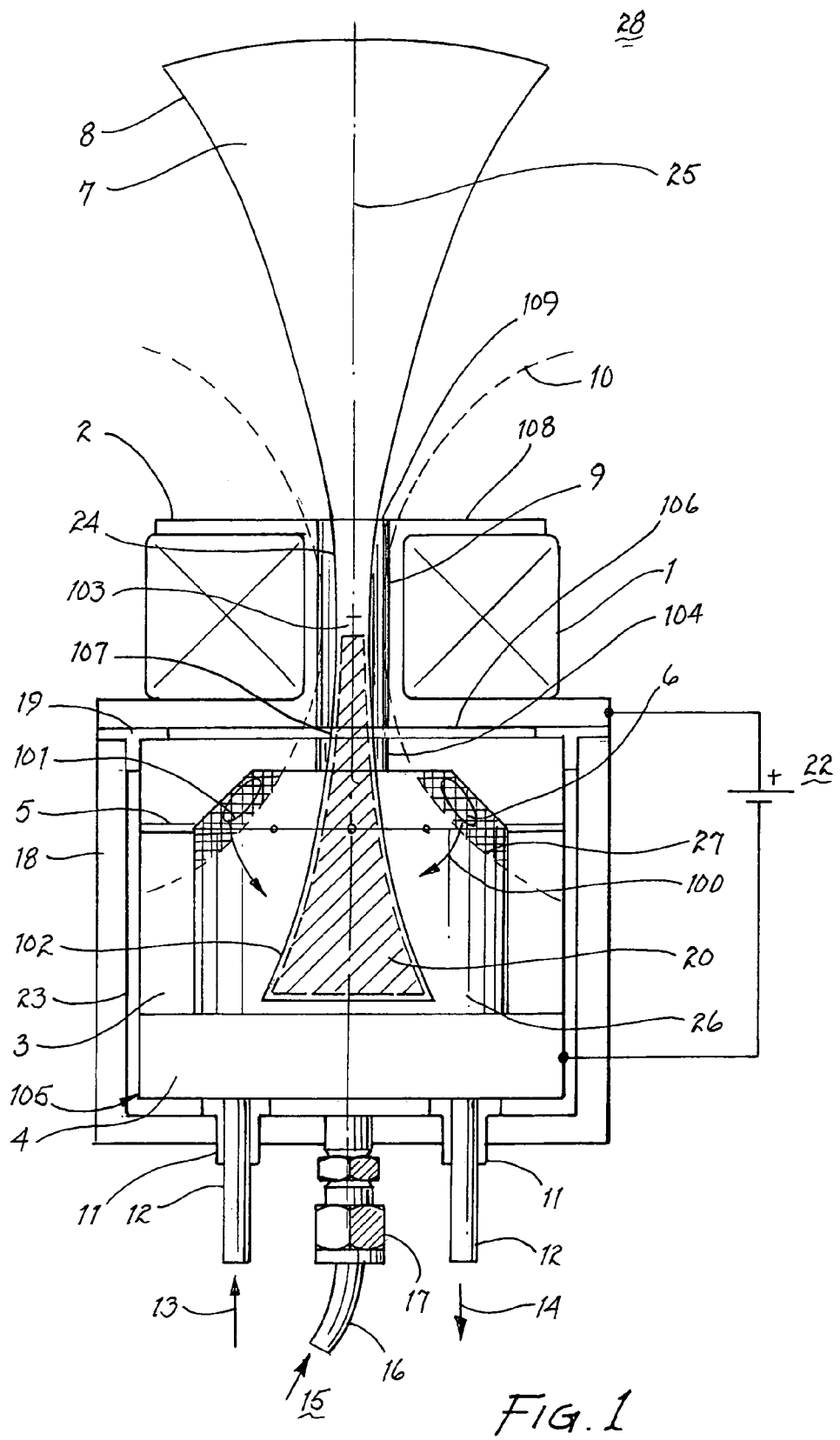
FIG. 1 shows a section view of a magnetron plasma source.
Figure 2:
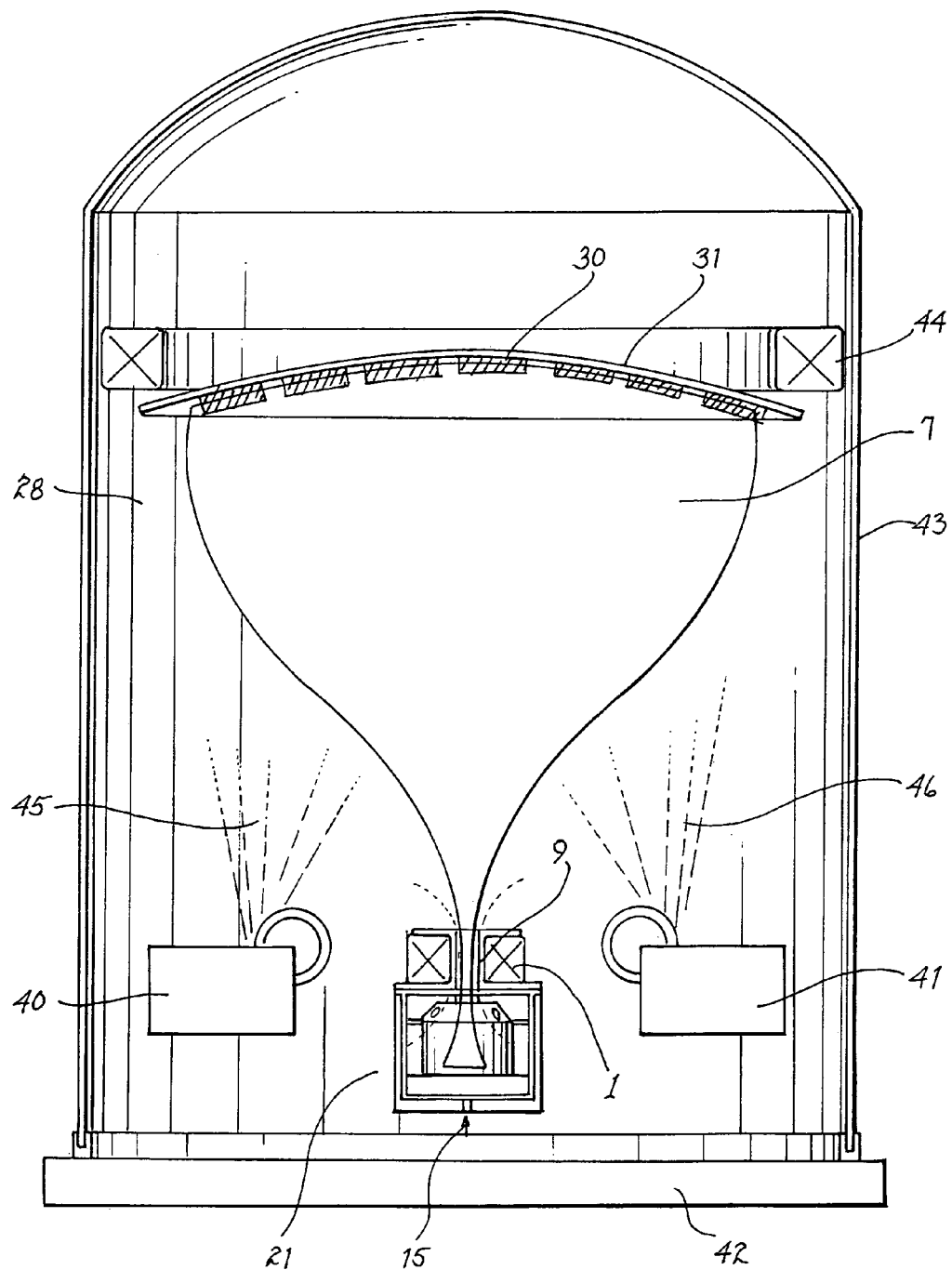
FIG. 2 shows a section view of a magnetron plasma source in a bell jar coater with electron beam evaporation sources.

FIG. 1 shows a section view of a magnetron plasma source 21. The source exists in a vacuum such as process chamber 28 (FIG. 2). The preferred embodiment shown is a round source, as indicated by centerline 25. Electromagnet coil 1 is wound on and supported by spool 2. Spool 2 is axis symmetric with discharge cavity 26 and comprises a first end 106 formed to include a first aperture 107, a second end 108 formed to include a second aperture 109, and a conduit nozzle 9 extending through the spool interconnecting the first aperture and the second aperture, where the first end of spool 2 is adjacent to the top portion of discharge cavity 26, such that nozzle 9 interconnects discharge cavity 26, and process chamber 28 (FIG. 2).

The electromagnet 1 is water cooled by flowing water through a current carrying hollow conductor (not shown). Fabrication of water cooled electromagnets is well known and other techniques may be used. For low power applications or by design, the electromagnet may not require water cooling. Spool 2 has a conduit passing through the center of the spool that forms a region of reduced area termed the nozzle 9. This spool 2 is constructed of copper to readily conduct heat, be non-magnetic, to conduct electricity and to be resistant to insulating oxide buildup. Other materials affording these properties can also be used or materials and coatings may be combined to achieve these results. Spool 2 is attached through insulator 19 to aluminum housing 18 by electrically insulating fasteners not shown.

Inside housing 18 is the magnetron sputter cathode electrode 105 formed from water cooled base 4 and sputter target 3. Base 4 is cooled by water flowing in 13 and out 14 through pipes 12. Sputter target 3 is fastened onto base 4 by screws not shown. Insulators 11 and 19 hold the cathode 105 in place inside housing 18. Process gas 15 is introduced into discharge region 26 through tube 16, fitting 17, gap 23 and multiple distribution holes 5. Insulator 19 is continuous between housing 18 and target 3 sealing the volume of gap 23 and thereby causing the gas 15 in gap 23 to pass through holes 5.

Power supply 22 is connected to magnetron sputter cathode 105 and to spool anode 2 as schematically shown. Housing 18 is electrically floating. When current is passed through electromagnet 1, a solenoid magnetic field is formed as partially depicted by the drawn field lines 8 and 10. The magnetic field performs several functions: 1) Field lines at 27 create a magnetron type electrostatic/magnetic electron trap 101 inside discharge cavity 26 adjacent to sputter target 3. 2) A region 24 of relatively strong field is formed inside nozzle 9. 3) A less strong, expanded field region 20 is formed inside discharge cavity 26. And, 4) A less strong, expanded region 7 is formed outside the source in the main vacuum process chamber 28. The strength of this magnetic field must at least be sufficient to confine electrons in magnetron region 101. This means the field in this region must exceed 100 gauss. By design, creating a field of sufficient strength in region 101 produces even a stronger field in nozzle 9. Secondly, the field 24 must be strong enough inside the nozzle 9 to significantly impede electrons from reaching the sides of nozzle 9. This will be further described below.

To operate the source, process gas 25 is introduced into discharge cavity 26 such that the pressure inside cavity 26 is in the millitorr region. With gas 15 flowing and the electromagnet 1 generating a solenoid magnetic field as described above, a closed drift magnetron sputter cold cathode plasma 6 is ignited when power supply 22 is turned on and a sufficient voltage is applied (typically 200–800V). Plasma 6 in turn generates an electron flow 100 from the sputter target 3 toward anode spool 2. Due to the solenoid magnetic field 24, electrons 100 are impeded from reaching the spool 2 and are conducted through nozzle 9 along field lines 24 into the process chamber 28. As the electrons 100 flow through nozzle 9 they collide with gas 15 also flowing through nozzle 9, ionize gas 15 and generate a dense plasma 7 that emanates out of nozzle 9. This plasma 7 is useful for modifying or coating substrates located in the process chamber 28.

The following describes the source operating principles and features in more detail:

One advancement of the present invention is the use of a magnetron sputter cold cathode 105 as an electron source. Many different electron sources are known for generating and sustaining a glow discharge or ion source. Common electron sources are thermionic filaments, hollow cathodes and heated, low work function materials. While these have useful applications, the lifetime of these electron sources are shortened when operated in oxygen. Typically these electron sources require oxygen be delivered outside the source discharge cavity to minimize oxygen contact with the sensitive electron source. In these sources, an inert gas such as argon flows through the discharge cavity and is the primary ionized gas. The oxygen gas is ionized or 'activated' outside the source by the emanating argon plasma. While this method extends the life of the electron source, it is less efficient at producing a reactive oxygen plasma. Also, the argon gas adds to the system vacuum pumping load. Contrary to these hot electron emitters, a magnetron cold cathode 105 electron source actually benefits from the use of a reactive gas 15 such as oxygen: In oxygen, sputtering of target 3 can occur at a slower rate and the secondary electron emission yield is higher. Therefore with oxygen, the magnetron plasma cathode 105 produces a higher electron 100 flow for a given discharge voltage than if argon were used. This effect can be varied and is dependent upon the selection of target 3 material. For instance an aluminum target 3 sputters very slowly in oxygen and the oxide of aluminum has a relatively high secondary electron emission characteristic. Aluminum has other benefits as a target 3 material in that it is non-magnetic, conducts heat well, is low cost and is easily machine-able. Other materials may also be used as can composite materials or stacked layers of materials. When aluminurm was used, the sputter rate indicated by inspecting target 3 after exended operation appears to be low.

In operation, electrons 100, created in magnetron sputter plasma 6, attempt to travel to spool 2 to complete the electrical circuit. As the electrons 100 attempt this journey, they are impeded at several turns. First, as the electrons move from region 20 in discharge cavity 26 into nozzle region 24, they are impeded by the magnetic mirror between weak field region 20 and strong field region 24. This creates an electron containment zone 102 inside cavity 26. The oscillating electrons 100 trapped in this mirror are coincident with the process gas 15 attempting to flow from cavity 26 to process chamber 28 through nozzle 9. The subsequent electron-gas collisions produce a visible plasma 20 in cavity 26. The electrons 100 attempting to reach anode spool 2 are again blocked by their inability to cross magnetic field lines 24 in nozzle 9. Therefore, even after they succeed in passing through the magnetic mirror from region 20 to region 24, they still can not reach spool 2. Instead the electrons are trapped in a form of a Penning cell bounded by cathode base 4, the substrates 30 in the process chamber 28 in region 7 and the annular anode in nozzle 9. In effect, the substrates become one cathode of the Penning Cell. While the source operation can be viewed in this way, due to the mirror containment between region 20 and region 24, in fact, the substrates can be connected to the anode or biased positively. In a true Penning cell configuration, connection of one cathode to the anode would remove the low impedance electron confining aspects of the design.

The reduced diameter nozzle 9 separates the discharge cavity 26 from the main vacuum chamber substrate processing area 28. There are several advantages to this: 1) A reduced diameter of nozzle 9 makes generating a strong solenoid magnetic field 24 inside the nozzle 2 easier. 2) Magnetron sputter plasma 6 requires a gas pressure typically in the low millitorr range while electron beam and thermal evaporation processes operating in process chamber 28 require operating pressures in the $10^{-4}$ Torr region or lower. A reduced nozzle 9 diameter between the magnetron plasma discharge cavity 26 and the external vacuum chamber 28 produces the necessary conductance limitation to allow the magnetron plasma 6 to exist at a higher pressure than region 28. Note that this is not mandatory for operation. For instance, chamber 28 can be operated in the millitorr range without detriment to the magnetron plasma source. It is also noted that by injecting gas 15 directly into the magnetron confined region 101 through holes 5, sputter plasma 6 is sustained at discharge cavity pressures below 1 mTorr. 3) A reduced nozzle 9 diameter between discharge cavity 26 and process section 28 reduces possibly contaminating sputtered particles from reaching region 28. Particles sputtered from target 3 are typically condensable and the design of the source creates a torturous path for these particles to leave source 21. The obstacles include the initial orientation of target 3 away from target opening 104, the reduced size of opening 104 in cathode target 3 and the reduced area of nozzle 9. In operation, the nozzle 9 remain relatively free of coating. This indicates that most of the condensate sputtered does not leave cathode discharge cavity 26.

The diameter of nozzle hole 9 is determined by several factors: The diameter must be large enough so that as electrons are gyrating along magnetic field lines in region 24, they do not encounter the sides of the nozzle. For instance, for a magnetic field strength of 500 gauss in region 24 and an electron temperature of 2 eV, the gyro radius is 0.1 mm. Therefore, a nozzle diameter of 1 centimeter will provide clearance for these electrons. A larger diameter (1 centimeter) is called for because while 2 eV may be the overall electron 'temperature', there will be some number of high energy electrons within the total population. If these are close to the cathode potential of 100 eV, then their gyro radius will be approximately 1 mm. If a 2 mm nozzle were used, these electrons would be lost to the plasma. Containment of the higher energy electrons is important and therefore, a nozzle diameter closer to 1 cm or larger is preferred. Competing with the electron diffusion concern is the need to keep the nozzle diameter small to present a conductance limitation to gas flow out of discharge cavity 26 and to reduce the sputtered material exiting from discharge cavity 26. In one preferred embodiment, the nozzle hole was 1.3 cm in diameter. With this diameter the source 21 was operated in oxygen continuously with the main vacuum chamber remaining at $3\times10^{-4}$ Torr. Another aspect of the conduit dimension between the discharge cavity 26 and process chamber 28 is the hole 104 diameter in target 3. This hole 104 should be the same diameter as nozzle 9. If this hole 104 were a larger diameter, electrons exiting cavity 26 could follow a magnetic field line and contact spool 2. By making hole 104 the same size as nozzle 9, electrons 100 following field lines out of hole 104 do not contact spool 2 and their energy can be efficiently expended ionizing process gas.

FIG. 2 shows magnetron plasma source 21 inside bell jar vacuum chamber 42 and 43. Two electron beam evaporation sources 40 and 41 produce evaporant clouds 45 and 46. A substrate holder 31 supports substrates 30. The holder 31 is rotated by known techniques so that substrates 30 are uniformly processed. An auxiliary electromagnet coil 44 is positioned behind substrate holder 31 to direct the magnetic field emanating through nozzle 9 through substrates 30. By this method, confined plasma 7 contact with the chamber jar 43 is reduced while the plasma 7 density at the substrates 30 is increased. The depiction of additional coil 44 is one example how additional magnetic means, electromagnets, permanent magnets or high permeability materials can be used to augment the solenoid magnetic field created by electromagnet 1 and effect emanating plasma 7. With the evaporation sources 40 and 41 shown, the magnetron plasma source 21 can be used with oxygen to react materials evaporated from sources 40 and 41. The depiction of electron beam sources 40 and 41 are intended to present one example of how magnetron plasma source 21 can be used. There are many different configurations and uses possible. A list of configurations and applications would include:

- The process gas 15 'blown' through the magnetron plasma source can be either a reactive gas or an inert gas. In the case of an inert gas 15, the plasma 7 generated by the magnetron plasma source can be effective in making the growing films on substrates 30 more dense.
- A magnetron plasma source 21 can be combined with sputter magnetron deposition sources or other deposition sources such as cathodic arc sources.
- The magnetron plasma source 21 can be applied to processes such as: plasma enhanced chemical vapor deposition, plasma or reactive ion etch processes and or plasma treatment and surface modification processes.

While a specific preferred embodiment has been disclosed, one skilled in the art will be aware of several variations that remain within the spirit of the invention. Some of the variations would include:

- The shape and size of the magnetron plasma source can be changed without altering the basic principles. For instance the source 21 can be made annular or rectangular. Also the nozzle 9 length can be extended or shortened.

If the process vacuum section 28 can operate at millitorr pressures, the nozzle 9 diameter can be made larger. This can allow ionized sputtered material from target 3 to exit source 21.

The gas 15 injection means inside discharge cavity 26 can be changed without dramatically changing source 21 operation. For instance, gas 15 could enter cavity 26 through a hole in the bottom of base 4.

The nozzle 9 can be connected to the power supply 22 anode electrode, left electrically floating or be connected to the cathode 105. Because of the relatively high electron mobility along magnetic field lines, the anode electrode can be remote from the source 21 and sufficient field can still be injected into discharge cavity 26 to start plasma 6.

The solenoid magnetic field 24 strength can be increased from the minimums described above.

Multiple process gases 15 can be directed through discharge cavity 26 or alternatively, some gases can be injected after source 21 into the main chamber region 28. To activate gases delivered outside source 21, the gas might be injected into plasma 7 close to the nozzle 9 opening.

Additional electromagnets, permanent magnets or high permeability materials can be used to augment the solenoid electromagnet 1 and to shape plasma 7.

A variety of discharge power supplies may be used. The magnetron plasma source can be operated using a standard DC magnetron power supply. Alternatively, pulsed DC or AC, from 0–100 MHz frequencies, can be used The substrates can be separately biased, connected to ground or left electrically floating.

Magnetron target 3 can be made of a variety of materials to accomplish different goals. For instance the target 3 can be made of a high secondary electron material or be a composite of multiple materials. Alternatively, the target 3 can be a material to be sputtered out of source 21. In certain embodiments, target 3 is formed from a material having a secondary electron emission of 1.0 or greater. In certain embodiments, sputter target is formed from a material having a sputter efficiency of 100 Å-cm$^2$/min-W or less.

While the preferred embodiments of the present invention have been illustrated in detail, it should be apparent that modifications and adaptations to those embodiments may occur to one skilled in the art without departing from the scope of the present invention as set forth in the following claims.

I claim:

1. A plasma source, comprising:
a process chamber;
a cylindrical discharge cavity comprising a cathode disposed therein;
a magnetron sputter cold cathode electron source disposed within said discharge cavity;
a spool anode, axis symmetric with said cavity, comprising a first end formed to include a first aperture, a second end formed to include a second aperture, and a conduit nozzle extending through said spool interconnecting said first aperture and said second aperture, wherein said first end of said spool is adjacent to the top portion of said discharge cavity; and wherein said nozzle interconnects said discharge cavity and said process chamber;
an electromagnet wound around said spool, wherein said electromagnet generates a magnetic field disposed within said process chamber, said discharge cavity, and said nozzle;
a power supply interconnected between said cathode and said spool anode wherein electrons emanating from said magnetron sputter cathode electron source are impeded from reaching said anode by said magnetic field.

2. The source of claim 1, further comprising:
a supply of one or more process gases;
a conduit interconnecting said process gas supply and said discharge cavity;
wherein one of said one or more process gases comprises oxygen.

3. The source of claim 2, further comprising:
a sputter target disposed within said discharge cavity, wherein said sputter target is formed from a material having a secondary electron emission of 1.0 or greater.

4. The source of claim 3, wherein said sputter target is formed from a material having a sputter efficiency of 100 Å-cm$^2$/min-W or less.

5. The source of claim 4, wherein said cathode comprises said sputter target.

* * * * *